(12) United States Patent
Choi et al.

(10) Patent No.: US 10,321,571 B2
(45) Date of Patent: Jun. 11, 2019

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Yu Jin Choi, Suwon-si (KR); Soo Hwan Son, Suwon-si (KR); Min Kyoung Cheon, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 65 days.

(21) Appl. No.: 15/295,502

(22) Filed: Oct. 17, 2016

(65) Prior Publication Data

US 2017/0196092 A1    Jul. 6, 2017

(30) Foreign Application Priority Data

Jan. 4, 2016  (KR) .................. 10-2016-0000540

(51) Int. Cl.
*H05K 1/18* (2006.01)
*H01G 4/008* (2006.01)
(Continued)

(52) U.S. Cl.
CPC ............. *H05K 1/181* (2013.01); *H01G 2/06* (2013.01); *H01G 4/0085* (2013.01); *H01G 4/224* (2013.01); *H01G 4/228* (2013.01); *H01G 4/30* (2013.01); *H01G 4/40* (2013.01); *H01G 9/012* (2013.01); *H01G 9/042* (2013.01); *H01G 9/08* (2013.01); *H01G 9/15* (2013.01); *H01G 15/00* (2013.01); *H05K 1/111* (2013.01); *H01G 4/38* (2013.01); *H05K 2201/10015* (2013.01); *Y02P 70/611* (2015.11)

(58) Field of Classification Search
CPC ............ H05K 1/181; H01G 2/06; H01G 4/40; H01G 4/228; H01G 4/224; H01G 9/15; H01G 9/042

See application file for complete search history.

(56) References Cited

U.S. PATENT DOCUMENTS 6,525,395 B1    2/2003  Kawase et al.
2007/0211414 A1*  9/2007  Pelcak ................ H01G 9/012
                                                   361/541

(Continued)

FOREIGN PATENT DOCUMENTS

JP    01073610 A  *  3/1989
JP    01091411 A  *  4/1989

(Continued)

OTHER PUBLICATIONS

Notice of Office Action dated Jan. 12, 2017, in corresponding Korean Patent Application No. 10-2016-0000540, with English language translation.

*Primary Examiner* — David M Sinclair
(74) *Attorney, Agent, or Firm* — Morgan Lewis & Bockius LLP

(57) ABSTRACT

A composite electronic component includes a multilayer capacitor including external electrodes, a tantalum capacitor disposed adjacently to the multilayer capacitor, first electrode parts connected to the external electrodes, a second electrode part connected to a second body, and an encapsulant encapsulating the multilayer capacitor and the tantalum capacitor and formed such that portions of the first and second electrode parts are exposed.

20 Claims, 3 Drawing Sheets

(51) Int. Cl.
*H01G 4/228* (2006.01)
*H01G 4/38* (2006.01)
*H01G 4/224* (2006.01)
*H01G 4/30* (2006.01)
*H01G 9/042* (2006.01)
*H01G 9/08* (2006.01)
*H01G 15/00* (2013.01)
*H05K 1/11* (2006.01)
*H01G 4/40* (2006.01)
*H01G 9/012* (2006.01)
*H01G 9/15* (2006.01)
*H01G 2/06* (2006.01)

(56) References Cited

U.S. PATENT DOCUMENTS

2008/0247122 A1* 10/2008 Vaisman ............... H01G 2/065
 361/533
2009/0154065 A1* 6/2009 Choi ....................... H01G 9/012
 361/523
2010/0033904 A1 2/2010 Niki
2013/0058002 A1* 3/2013 Oh ........................... H01G 4/30
 361/301.4
2016/0133391 A1* 5/2016 Navratil ................. H01G 9/052
 361/528

FOREIGN PATENT DOCUMENTS

| | | | |
|---|---|---|---|
| JP | 01109711 A | * | 4/1989 |
| JP | 6-84687 A | | 3/1994 |
| JP | 1997-232196 A | | 9/1997 |
| JP | 2000182888 A | * | 6/2000 |
| JP | 2000200731 A | * | 7/2000 |
| JP | 2001-118731 A | | 4/2001 |
| JP | 2001332446 A | * | 11/2001 |
| WO | 2008/044483 A1 | | 4/2008 |

* cited by examiner

COMPOSITE ELECTRONIC COMPONENT AND BOARD HAVING THE SAME

CROSS-REFERENCE TO RELATED APPLICATION(S)

This application claims the benefit of priority to Korean Patent Application No. 10-2016-0000540, filed on Jan. 4, 2016 in the Korean Intellectual Property Office, the entirety of which is incorporated herein by reference.

TECHNICAL FIELD

The present disclosure relates to a composite electronic component and a board having the same.

BACKGROUND

In accordance with recent trends toward miniaturization, increases in capacitance, and improvements in the efficiency of components for mobile devices, research has been conducted into a capacitor having high capacitance, as well as low equivalent series resistance (ESR) and low equivalent series inductance (ESL), and excellent direct current (DC)-bias characteristics.

Multilayer capacitors have been generally used in many electronic devices. However, while such multilayer capacitors may have low ESR and ESL, DC-bias characteristics thereof may be worse than those of tantalum capacitors, and there may be difficulty in implementing high capacitance.

In addition, when a multilayer capacitor is directly mounted on a board, acoustic noise may be generated.

On the other hand, tantalum capacitors may allow for the implementation of high capacitance and may have excellent DC-bias characteristics, but have high ESR.

Therefore, there has been increased demand for a capacitor having high capacitance as well as low ESR and ESL, and excellent DC-bias characteristics and acoustic noise characteristics.

SUMMARY

An exemplary embodiment in the present disclosure provides a composite electronic component having high capacitance, low equivalent series resistance (ESR) and low equivalent series inductance (ESL), while having excellent direct current (DC)-bias characteristics and acoustic noise characteristics. An exemplary embodiment in the present disclosure provides a composite electronic component including a multilayer capacitor and a tantalum capacitor connected to each other in parallel, and a board having the same.

According to an exemplary embodiment in the present disclosure, a composite electronic component includes: a multilayer capacitor including external electrodes; a tantalum capacitor disposed adjacently to the multilayer capacitor; first electrode parts electrically connected to the external electrodes; a second electrode part electrically connected to a second body; and an encapsulant encapsulating the multilayer capacitor and the tantalum capacitor and formed such that portions of the first and second electrode parts and the tantalum wire are exposed, thereby having high capacitance, low ESR and low ESL, and excellent DC-bias characteristics and acoustic noise characteristics.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
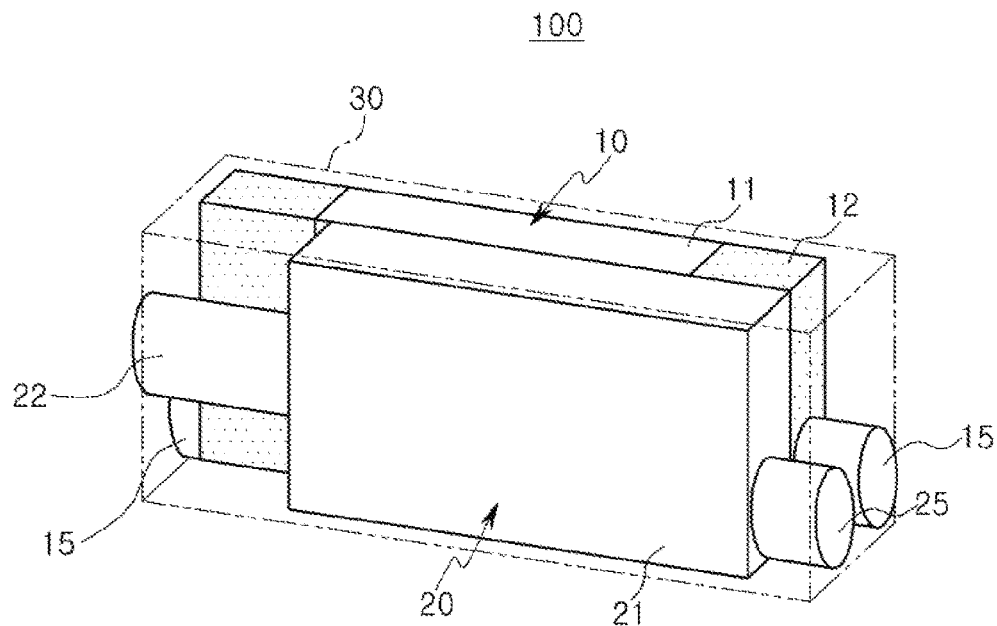
FIGS. 1 through 3 are perspective views illustrating a composite electronic component according to an exemplary embodiment in the present disclosure.

Hereinafter, exemplary embodiments of the present disclosure will be described in detail with reference to the accompanying drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Hereinafter, a composite electronic component according to an exemplary embodiment in the present disclosure will be described.

A composite electronic component according to an exemplary embodiment in the present disclosure may include a multilayer capacitor, a tantalum capacitor, a first electrode part, a second electrode part, and an encapsulant.

The tantalum capacitor may be disposed adjacently to the multilayer capacitor.

The first electrode part may be electrically connected to the multilayer capacitor, and the second electrode part may be electrically connected to the tantalum capacitor.

The encapsulant may encapsulate the multilayer capacitor and the tantalum capacitor such that portions of the first electrode parts, the second electrode part and the tantalum wire are exposed.

According to an exemplary embodiment in the present disclosure, due to a structure of the composite electronic component including the multilayer capacitor and the tantalum capacitor, acoustic noise may be decreased, high capacitance may be implemented, equivalent series resistance (ESR) and equivalent series inductance (ESL) may be decreased, and direct current (DC)-bias characteristics may be improved.

Generally, in a case in which only the tantalum capacitor is mounted, high capacitance may be implemented, and DC-bias characteristics may be excellent, but ESR may be high.

On the other hand, in a case in which only the multilayer capacitor is mounted, ESR and ESL may be low, but DC-bias characteristics may be worse than those of the tantalum capacitor and it may be difficult to implement high capacitance. In addition, when the multilayer capacitor is directly mounted on a board, acoustic noise may be generated.

The composite electronic component according to an exemplary embodiment in the present disclosure includes both the multilayer capacitor and the tantalum capacitor, whereby high ESR, a disadvantage of the tantalum capacitor, may be decreased, and deterioration of DC-bias characteristics, a disadvantage of the multilayer capacitor, may be avoided.

Figure 2:
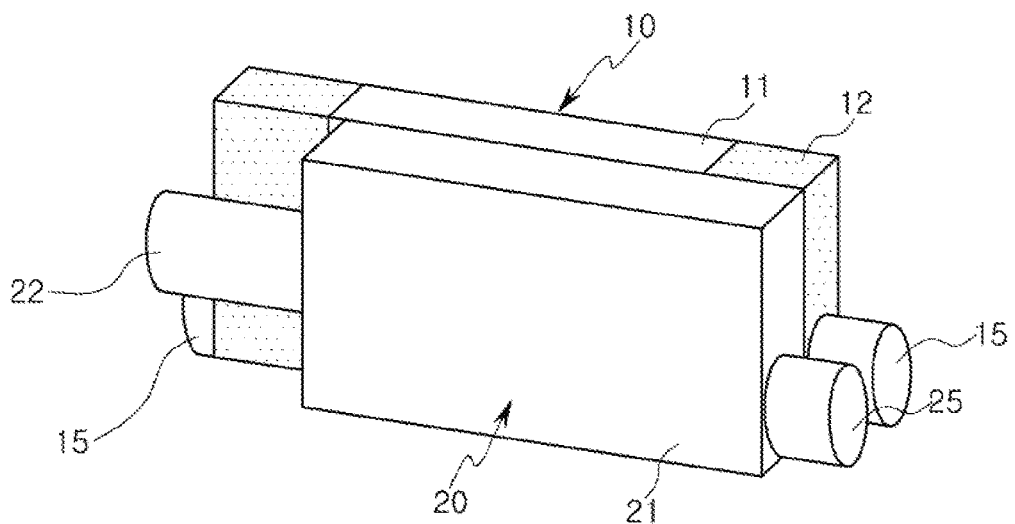
Figure 3:
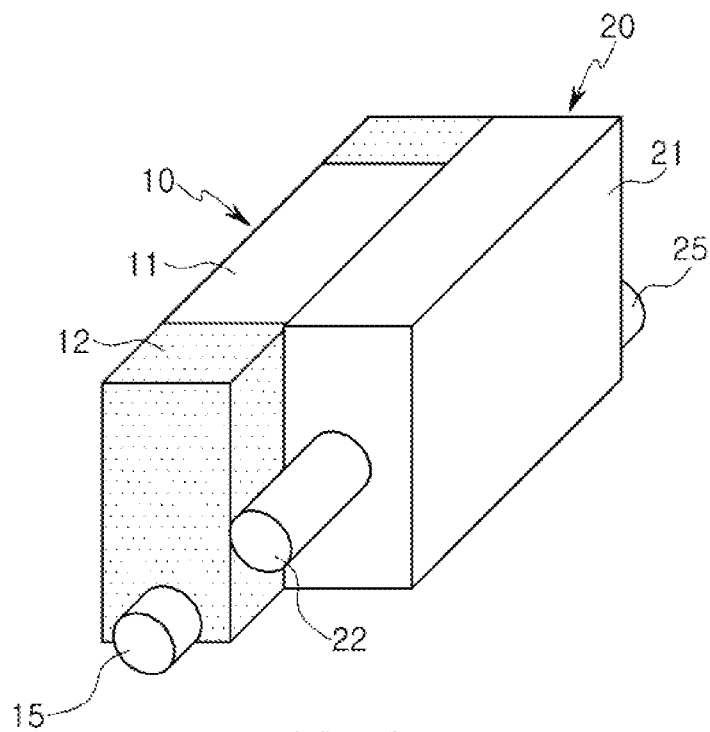

FIGS. 1 through 3 are perspective views illustrating a composite electronic component according to an exemplary embodiment in the present disclosure.

Referring to FIGS. 1 through 3, the composite electronic component according to the present exemplary embodiment includes a multilayer capacitor 10 including a first body 11 and external electrodes 12 formed on first and second end surfaces of the first body 11, a tantalum capacitor 20 including a second body 21 and a tantalum wire 22 exposed to a first end surface of the second body 21 and disposed adjacently to the multilayer capacitor 10, first electrode parts 15 connected to the external electrodes 12, a second electrode part 25 connected to the second body 21, and an encapsulant encapsulating the multilayer capacitor 10 and the tantalum capacitor 20 and formed such that portions of the first and second electrode parts 15 and 25 and a portion of the tantalum wire 22 are exposed.

The first body 11 may have an approximately hexahedral shape including the first and second end surfaces and surfaces connecting the first and second end surfaces to each other.

The first body 11 may include internal electrodes (not illustrated).

The internal electrodes may include first and second internal electrodes. The first and second internal electrodes may be alternately disposed on dielectric layers (not illustrated) with at least one of the dielectric layers interposed therebetween.

The first and second internal electrodes may be formed of a conductive paste containing a conductive metal. Here, the conductive metal may be one or more selected from the group consisting of a noble metal such as palladium (Pd), a palladium-silver (Pd—Ag) alloy, or the like, nickel (Ni), and copper (Cu), but is not limited thereto.

The first and second internal electrodes may be exposed to the first and second end surfaces of the first body, respectively. That is, the first internal electrodes may be exposed to the first end surface of the first body, and the second internal electrodes may be exposed to the second end surface of the first body.

The first body 11 may be formed by stacking and then sintering a plurality of dielectric layers and the internal electrodes.

The dielectric layer may contain ceramic powder particles having a high-k.

The ceramic powder may be, for example, a barium titanate ($BaTiO_3$) based powder or a strontium titanate ($SrTiO_3$) based powder, but is not limited thereto.

The external electrodes 12 may be disposed on the first and second end surfaces of the first body 11.

The external electrodes may include first and second external electrodes, and the first and second external electrodes may be respectively electrically connected to the first and second internal electrodes exposed to the outside of the first body.

The first external electrode may be electrically connected to the first internal electrodes exposed to the first end surface of the first body, and the second external electrode may be electrically connected to the second internal electrodes exposed to the second end surface of the first body.

Plating layers formed of nickel (Ni) and tin (Sn) may be formed on the external electrodes. That is, the multilayer capacitor may include the plating layers formed by nickel/tin plating.

The tantalum capacitor 20 may include the second body 21 and the tantalum wire 22. The tantalum wire 22 may be partially buried in the second body 21 so that a portion thereof in a length direction is exposed through the first end surface of the second body 21.

In the tantalum capacitor 20, a tantalum capacitor having a structure in which an internal lead frame is not present, the tantalum wire 22 may be exposed to a first end surface of the encapsulant 30 in the length direction, thereby implementing a capacitance as large as possible as compared to a structure according to the related art.

The tantalum wire 22 may be connected to an anode terminal for mounting the tantalum capacitor on a board.

The second body 21 of the tantalum capacitor may include an anode wire, a dielectric layer, a polymerization layer, a carbon layer, and a cathode layer containing silver (Ag).

The anode wire may be formed of a porous sintered material of tantalum powder particles.

The dielectric layer may be formed on a surface of the anode wire.

The dielectric layer may be formed by oxidizing the surface of the anode wire. For example, the dielectric layer may be formed of a dielectric material formed of tantalum oxide ($Ta_2O_5$), an oxide of tantalum forming the anode wire, and be formed at a predetermined thickness on the surface of the anode wire.

The polymerization layer may be formed on a surface of the dielectric layer.

The polymerization layer may contain one or more of a conductive polymer and manganese dioxide ($MnO_2$).

In a case in which the polymerization layer is formed of the conductive polymer, the polymerization layer may be formed on the surface of the dielectric layer by a chemical polymerization method or an electrolytic polymerization method. A material of the conductive polymer is not particularly limited as long as it is a polymer having conductivity, and may include, for example, polypyrrole, polythiophene, polyaniline, or the like.

In a case in which the polymerization layer is formed of the manganese dioxide ($MnO_2$), conductive manganese dioxide may be formed on the surface of the dielectric layer by immersing the anode wire having the dielectric layer formed on the surface thereof in a manganese aqueous solution such as manganese nitrate and then decomposing the manganese aqueous solution by heating.

The carbon layer containing carbon may be disposed on the polymerization layer.

The carbon layer may be formed of a carbon paste and be formed by applying the carbon paste patterns in which conductive carbon material powder particles such as natural graphite, carbon black, or the like, are dispersed in water or an organic solvent in a state in which they are mixed with a binder, a dispersing agent, or the like, onto the polymerization layer.

The cathode layer containing a conductive metal may be disposed on the carbon layer in order to improve electrical connectivity between the carbon layer and a cathode terminal. The conductive metal contained in the cathode layer may be silver (Ag).

In a composite electronic component according to the related art including a multilayer capacitor and a tantalum capacitor, resin electrodes containing silver (Ag) were used in order to connect terminals of the multilayer capacitor and the tantalum capacitor to a board at the time of mounting the composite electronic component on the board. In detail, in order to lead the terminals of the multilayer capacitor and the tantalum capacitor, the resin electrodes containing silver (Ag) were formed on an external electrode of the multilayer capacitor corresponding to an anode portion, an external electrode of the multilayer capacitor and a second body of the tantalum capacitor corresponding to a cathode portion to perform connection between the terminals and the board.

However, in this case, it was difficult to connect all of the terminals of the multilayer capacitor and the tantalum capacitor to the board, and the external electrodes of the multilayer capacitor reacted with the resin electrodes containing silver (Ag), such that an ESR was significantly increased.

The composite electronic component according to the present exemplary embodiment may include the first electrode parts 15 electrically connected to the external electrodes 12 and the second electrode part 25 connected to the second body 21. That is, the materials connecting the terminals of the multilayer capacitor and the tantalum capacitor to the board may be different from each other.

Different materials may be used to connect the terminals of the multilayer capacitor and the tantalum capacitor to the board, whereby the terminals may be easily connected to the board, and acoustic noise and an ESR may be decreased in the composite electronic component according to the present exemplary embodiment as compared to a composite electronic component according to the related art.

In order to lead the terminals of the multilayer capacitor and the tantalum capacitor, the first electrode parts may be formed on the external electrodes of the multilayer capacitor corresponding to the anode portion and the cathode portion, and the second electrode part may be formed on the second body of the tantalum capacitor.

The first electrode parts 15 may be formed on portions of both end surfaces of the multilayer capacitor 10, and may be formed on lower sides of the first and second end surfaces of the multilayer capacitor 10.

The first electrode parts 15 may be formed on the external electrodes 12 formed on the first and second end surfaces of the first body 11.

The second electrode part 25 may be formed on a portion of the second end surface of the second body 21 of the tantalum capacitor 20, and may be formed on a lower side of the second end surface of the second body 21.

The second electrode part 25 may be formed on a surface of the second body 21 opposing the first end surface of the second body 21 to which the tantalum wire 22 is exposed.

The first and second electrode parts 15 and 25 may be formed on lower sides of surfaces of the multilayer capacitor and the tantalum capacitor, respectively.

The first electrode parts 15 may be formed of a solder paste.

The first electrode parts 15 may be formed of the solder paste to significantly decrease a change in bonding strength and characteristics of the external electrodes of the multilayer capacitor, thereby improving connection of the terminals to the board.

The second electrode part 25 may be a resin electrode. The second electrode part 25 may contain a base resin and conductive powder particles dispersed in the base resin.

Since the second body includes the cathode layer disposed at the outermost portion thereof and containing silver (Ag), the conductive powder particles may be silver (Ag) particles in order to improve bonding strength between the second electrode part 25 and a surface of the second body.

In addition, the conductive powder particles may contain copper (Cu), but are not limited thereto.

The base resin may be a thermosetting resin, for example, an epoxy resin.

Figure 4:
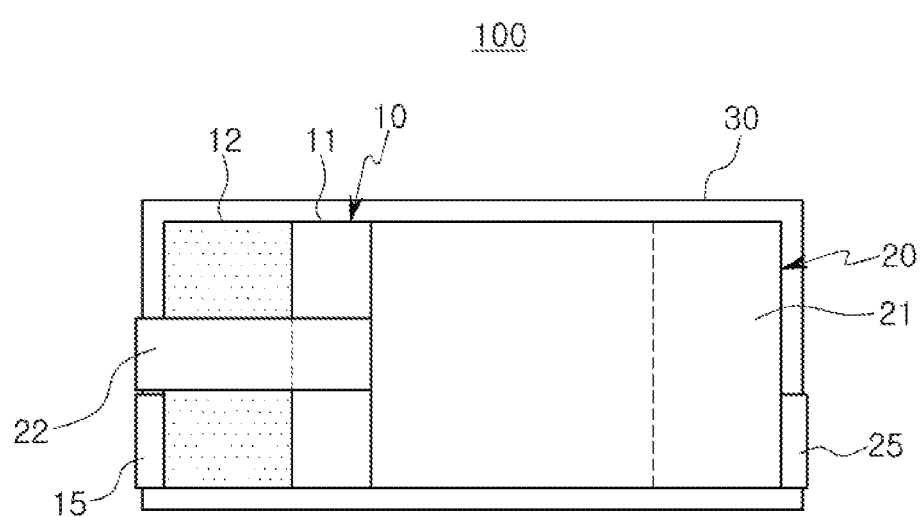
FIG. 4 is a cross-sectional view illustrating the composite electronic component according to an exemplary embodiment in the present disclosure.

FIG. 4 is a cross-sectional view illustrating the composite electronic component according to an exemplary embodiment in the present disclosure.

Referring to FIG. 4, the encapsulant 30 may encapsulate the multilayer capacitor 10 and the tantalum capacitor 20 and may be formed such that portions of the first and second electrode parts 15 and 25 and a portion of the tantalum wire 22 are exposed.

The encapsulant 30 may protect the multilayer capacitor 10 and the tantalum capacitor 20 from an external environment, and may be mainly formed of an epoxy or silica based epoxy molding compound (EMC), or the like, but is not limited thereto.

The encapsulant 30 may be implemented as one component in which the multilayer capacitor 10 and the tantalum capacitor 20 are combined with each other.

According to an exemplary embodiment in the present disclosure, the multilayer capacitor 10 and the tantalum capacitor 20 may be disposed adjacently to each other in a horizontal direction, may be vertically mounted at the time of being mounted, and may be connected to each other in parallel.

One surface of the first body connecting the first and second end surfaces of the first body 11 of the multilayer capacitor 10 to each other and one surface of the second body 21 of the tantalum capacitor 20 may be disposed to face each other.

In order to insulate the multilayer capacitor 10 and the tantalum capacitor 20 from each other, the composite electronic component according to an exemplary embodiment in the present disclosure may include an insulating layer (not illustrated) disposed between the multilayer capacitor and the tantalum capacitor.

The insulating layer (not illustrated) is not particularly limited as long as it has insulation properties, but may be formed of an insulating material such as a ceramic based material, or the like.

Hereinafter, a board having a composite electronic component according to an exemplary embodiment in the present disclosure will be described.

Figure 5:
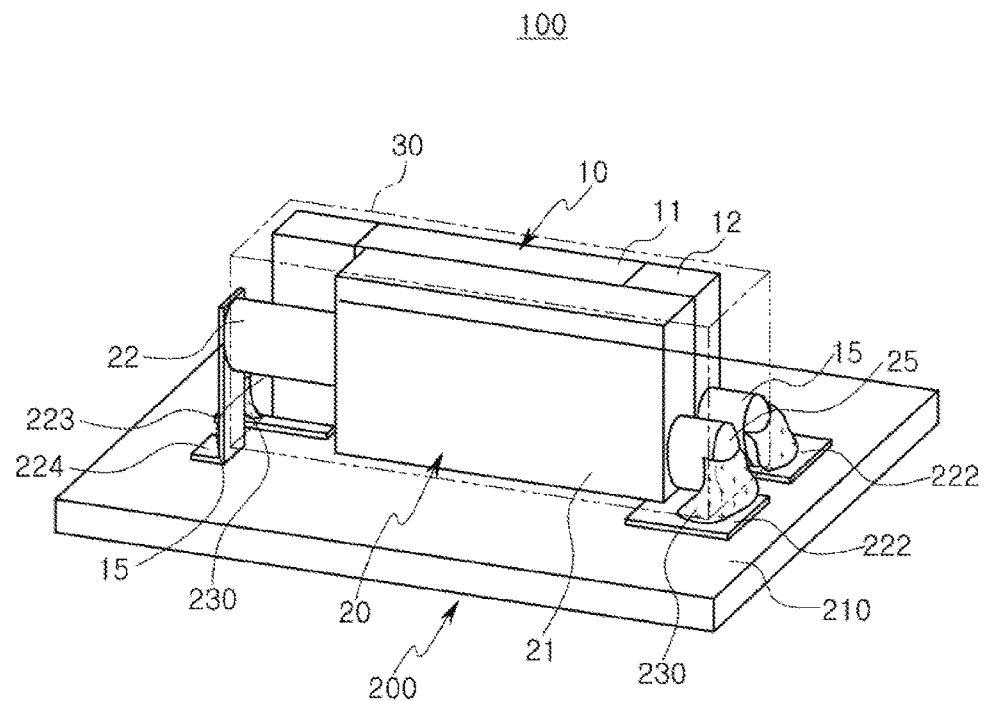
FIG. 5 is a perspective view illustrating an exemplary embodiment in which the composite electronic component is mounted on a printed circuit board.

FIG. 5 is a perspective view illustrating an exemplary embodiment in which the component electronic component is mounted on a printed circuit board.

In order to lead the terminals of the multilayer capacitor and the tantalum capacitor, the first electrode parts 15 may be formed on the external electrodes of the multilayer capacitor corresponding to the anode portion and the cathode portion, and the second electrode part 25 may be formed on the second body of the tantalum capacitor.

The encapsulant 30 may encapsulate the multilayer capacitor 10 and the tantalum capacitor 20 so that portions of the first and second electrode parts 15 and 25 and a portion of the tantalum wire 22 are exposed.

Referring to FIG. 5, a board 200 having a composite electronic component according to the present exemplary embodiment may include a printed circuit board 210 having electrode pads 222 to 224 disposed thereon, the composite electronic component 100 installed on the printed circuit board 210, and solders 230 connecting the electrode pads 222 to 224 and the composite electronic component 100 to each other.

The board 200 having a composite electronic component according to the present exemplary embodiment may include the printed circuit board 210 on which the composite electronic component 100 is mounted and two or more electrode pads 222 to 224 formed on an upper surface of the printed circuit board 210.

The electrode pads 222 to 224 may include a first electrode pad 222 connected to terminals to which one first electrode part 15 and the second electrode part 25 of the composite electronic component 100 are connected and second electrode pads 223 and 224 connected to the other first electrode part 15 and the anode terminal connected to the tantalum wire 22.

The first electrode part and the second electrode part, the cathode portion of the multilayer capacitor, may be connected to the first electrode pad, and the first electrode part and the tantalum wire, the anode portion of the multilayer capacitor, may be connected to the second electrode pads.

In this case, terminals to which the first electrode parts 15, the second electrode part 25, and the tantalum wire 22 of the composite electronic component 100 may be electrically connected to the printed circuit board 210 by the solders 230 in a state in which they are positioned on the first electrode pad 222 and the second electrode pads 223 and 224, respectively, so as to contact the first electrode pad 222 and the second electrode pads 223 and 224, respectively.

Since features of the composite electronic component are the same as those of the composite electronic component according to the exemplary embodiment in the present disclosure described above, a detailed description therefor will be omitted.

As set forth above, the composite electronic component according to an exemplary embodiment in the present disclosure may include the multilayer capacitor and the tantalum capacitor to have high capacitance, low ESR and low ESL, and excellent DC-bias characteristics and acoustic noise characteristics, whereby characteristics of a product may be improved.

While exemplary embodiments have been shown and described above, it will be apparent to those skilled in the art that modifications and variations could be made without departing from the scope of the present invention as defined by the appended claims.

What is claimed is:

1. A composite electronic component, comprising:
a multilayer capacitor including a first body and first and second external electrodes respectively disposed on first and second end surfaces of the first body;
a tantalum capacitor including a second body and a tantalum wire exposed to a first end surface of the second body, and disposed adjacently to the multilayer capacitor;
first electrode parts electrically connected to the first and second external electrodes of the multilayer capacitor;
a second electrode part electrically connected to the second body of the tantalum capacitor; and
an encapsulant encapsulating the multilayer capacitor and the tantalum capacitor,
wherein the second electrode part connected to the tantalum capacitor has a composition different from the first electrode parts connected to the first and second external electrodes of the multilayer capacitor, and the encapsulant is disposed such that portions of each of the separate first and second electrode parts, connected to the multilayer capacitor and the tantalum capacitor respectively and having different respective compositions, are exposed externally from the encapsulant.

2. The composite electronic component of claim 1, wherein the first electrode parts are formed of a solder paste.

3. The composite electronic component of claim 1, wherein the second electrode part is a resin electrode.

4. The composite electronic component of claim 3, wherein the second electrode part contains a base resin and conductive powder particles dispersed in the base resin.

5. The composite electronic component of claim 4, wherein the conductive powder particles contain silver (Ag).

6. The composite electronic component of claim 4, wherein the base resin is a thermosetting resin.

7. The composite electronic component of claim 1, wherein the second body includes a cathode layer formed on a surface thereof, the cathode layer containing silver (Ag).

8. The composite electronic component of claim 1, wherein the first electrode parts are formed on portions of first and second end surfaces of the multilayer capacitor.

9. The composite electronic component of claim 1, wherein the second electrode part is formed on a portion of a second end surface of the second body of the tantalum capacitor opposing the first end surface.

10. The composite electronic component of claim 1, wherein the encapsulant is formed such that a portion of the tantalum wire is exposed.

11. The composite electronic component of claim 1, wherein each of the first electrode parts, the second electrode part, and the tantalum wire are separately exposed on external surfaces of the composite electronic component.

12. The composite electronic component of claim 1, wherein the tantalum capacitor includes an electrode layer containing a metal on an external surface of the second body,
the first electrode parts include a solder paste, and
the second electrode part has a composition different from a composition of the first electrode parts and includes a base resin and conductive powder particles, of the metal contained in the electrode layer of the tantalum capacitor, dispersed in the base resin.

13. A board having a composite electronic component, comprising:
a printed circuit board having electrode pads disposed thereon;
the composite electronic component installed on the printed circuit board and including:
a multilayer capacitor including a first body and first and second external electrodes respectively disposed on first and second end surfaces of the first body,
a tantalum capacitor including a second body and a tantalum wire exposed to a first end surface of the second body, and disposed adjacently to the multilayer capacitor,
first and second electrode parts respectively disposed on the first and second external electrodes of the multilayer capacitor,
a third electrode part electrically connected to the second body of the tantalum capacitor, and
an encapsulant encapsulating the multilayer capacitor and the tantalum capacitor,
wherein the third electrode part connected to the tantalum capacitor is separate from the first and second electrode parts connected to the first and second external electrodes of the multilayer capacitor, and the encapsulant is disposed such that portions of each of the separate first, second, and third electrode parts, connected to the multilayer capacitor and the tantalum capacitor, and a portion of the tantalum wire are exposed externally from the encapsulant; and
solders each contacting and connecting one of the exposed and separate first, second, and third electrode parts to and one of the electrode pads.

14. The board having a composite electronic component of claim 13, wherein the first electrode part is formed of a solder paste.

15. The board having a composite electronic component of claim 13, wherein the third electrode part is a resin electrode.

16. The board having a composite electronic component of claim 15, wherein the third electrode part contains a base resin and conductive powder particles dispersed in the base resin.

17. The board having a composite electronic component of claim 13, wherein the second body includes a cathode layer formed on a surface thereof, the cathode layer containing silver (Ag).

18. The board having a composite electronic component of claim 13, wherein the first and second electrode parts are formed on portions of first and second end surfaces, respectively, of the multilayer capacitor.

19. The board having a composite electronic component of claim 13, wherein the third electrode part is formed on a portion of a second end surface of the second body of the tantalum capacitor opposing the first surface of the second body.

20. The board having a composite electronic component of claim 13, wherein the tantalum capacitor includes an electrode layer containing a metal on an external surface of the second body,
the first and second electrode parts include a solder paste, and
the third electrode part has a composition different from a composition of the first and second electrode parts and includes a base resin and conductive powder particles, of the metal contained in the electrode layer of the tantalum capacitor, dispersed in the base resin.

* * * * *